United States Patent
Herschbein et al.

(10) Patent No.: US 6,900,137 B2
(45) Date of Patent: May 31, 2005

(54) DRY ETCH PROCESS TO EDIT COPPER LINES

(75) Inventors: Steven B. Herschbein, Hopewell Junction, NY (US); Ville S. Kiiskinen, Newburgh, NY (US); Chad Rue, Poughkeepsie, NY (US); Carmelo F. Scrudato, Ossining, NY (US); Michael R. Sievers, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/249,289

(22) Filed: Mar. 28, 2003

(65) Prior Publication Data

US 2004/0188380 A1 Sep. 30, 2004

(51) Int. Cl.[7] .............................................. H01I 21/302
(52) U.S. Cl. ....................... 438/712; 438/705; 438/714; 438/717; 438/725; 438/734; 216/62; 216/66
(58) Field of Search ................................. 438/714, 725, 438/705, 712, 717, 723, 734; 216/62, 66, 67; 4387/712

(56) References Cited

U.S. PATENT DOCUMENTS

| | | | | |
|---|---|---|---|---|
| 6,468,917 B1 | * | 10/2002 | Li et al. ..................... | 438/712 |
| 6,645,872 B2 | * | 11/2003 | Russell et al. .............. | 438/712 |
| 6,653,240 B2 | * | 11/2003 | Crawford .................... | 438/712 |
| 6,730,237 B2 | * | 5/2004 | Sievers et al. ................ | 216/62 |
| 2004/0038433 A1 | * | 2/2004 | Fischer et al. ................. | 438/4 |
| 2004/0063330 A1 | * | 4/2004 | Crawford .................... | 438/712 |
| 2004/0082176 A1 | * | 4/2004 | Kane et al. ................. | 438/690 |

* cited by examiner

Primary Examiner—George A. Goudreau
(74) Attorney, Agent, or Firm—DeLio & Peterson, LLC; Kelly M. Reynolds; Steven Capella

(57) ABSTRACT

The present invention is directed to methods for editing copper features embedded within an organic body by exposing at least a portion of a top surface of the copper feature, forming a mill box there-over and then simultaneously milling both the copper feature and any organic material exposed through the mill box in a single step using an ion beam in combination with a $XeF_2$ gas for a dwell time of at least 10 milliseconds. The invention dramatically increases the efficiency of Focused Ion Beam milling of copper features embedded in organic layers by milling these features in a gas-depleted environment at significantly increased dwell time while avoiding the problems of graphitization, destruction of the organic layer and metal redeposition.

20 Claims, 6 Drawing Sheets

DRY ETCH PROCESS TO EDIT COPPER LINES

BACKGROUND OF INVENTION

The present invention relates generally to semiconductor editing, and in particular, to a method and system for dry etching copper features embedded within an organic layer.

Current processes for integrated circuit (IC) editing primarily rely on the use of a Focused Ion Beam (FIB) tool for spatially localized removal, deposition and editing of semiconductor materials. These FIB tools use a liquid metal ion source, typically gallium (Ga+), from which highly energetic beams are formed and focused onto the sample surface by electrostatic lenses. However, exposure to these highly energetic ion beams often causes IC surface damage, gallium contamination, and physical sputtering of the sample surface, which in turn, leads to the undesirable redeposition of sputtered material onto adjacent IC areas causing the circuit to short.

Additional problems have been presented in IC editing using FIB tools with the introduction of copper features for interconnect metallization, as well as with the introduction of organic-based materials to form circuits having inter-level dielectric (ILD) layers. A significant problem with copper features has been the undesired redeposition of sputtered copper as a result of insufficient ion beam compatible chemistries not completely volatilizing these copper etch byproducts. Further, exposure of organic-based layers to the highly energetic ion beams causes these organic layers to become more conductive by forming graphite surface layers and causing electrical leakage between metal features.

Gas-assisted etch (GAE) techniques have also been introduced to reduce or eliminate the above problems associated with FIB processing techniques, including, improving volatilization of by-products and removal of damaged ILD surface layers. In so doing, GAE chemistries, with the assistance of an ion beam, react with the organic layers to form volatile or non-conductive by-products. However, these GAE chemistries are often not reactive enough and show limited utility in both deep-hole FIB processing techniques as well as in editing metal features embedded within organic layers, and in particular, in editing copper features embedded within an organic layer.

Further, as it is desirable in gas-assisted FIB processing to maintain a gas-rich environment in the area being edited, it is standard practice to run these gas-assisted FIB processes for a minimum amount of time. It is believed that it is counter intuitive to have a gas-assisted FIB process run too long as the longer the process runs, the more gas-depleted the area becomes and thus the less efficient the milling process. Accordingly, increasing the duration of exposing a metal feature to a gas-assisted FIB process past conventional exposure times is avoided.

For example, standard practice for editing copper features embedded within an organic layer is to run a gas-assisted FIB $XeF_2$ mill dwell for 1 millisecond at a gas pressure of 2 Torr (BT setting of 2) to maintain a gas-rich environment during the milling process, therein avoiding increasing the dwell time beyond 1 millisecond. Further, running these standard gas-assisted FIB techniques requires a two-step process whereby the organic feature is first milled at standard default milling settings and then the standard default milling settings are used to mill the copper feature in the absence gas, or alternatively, the copper is milled using water. However, running these standard two-step gas-assisted FIB techniques, at a minimum amount of time, often provides inconsistent and inadequate editing of metal features within organic layers, particularly, modern metal features having smaller dimensions. They are also hard to control because of the fast milling rates, ineffective in deep holes and permit redeposition of byproducts of the edited metal feature. More global processes used to edit copper features within organic layers include wet etching and plasma/RIE processes. However, it has been found that these processes lead to localization and reaction termination difficulties. For instance, plasma/RIE processes cannot easily etch small areas (<1 square micron in width) without implementing masking materials, such as a photoresist. Additionally, the wet and plasma/RIE processes have a wide range of etch rates that are dependent on both the instrumentation and chemicals used during such processes. These variables make it extremely difficult to "turn-off" the reaction at the exact moment that all material has been removed. The plasma/RIE processes also undesirably may destroy small defects on the IC before such defects can be located and edited, thus, making it very difficult to edit metal features, particularly copper features, that are deeply embedded within an organic layer.

Accordingly, as conventional methods are not consistent or reliable for editing metal features, and in particular smaller (i.e., <1 square micron in width) copper features within organic layers, a need continues to exist in the art for methods that are capable of cleanly and reliably editing such copper features embedded in organic layers without creating any surface damage, contamination and re-deposition of the sputtered material onto other areas of the substrate.

SUMMARY OF INVENTION

Bearing in mind the problems and deficiencies of the prior art, it is therefore an object of the present invention to provide methods for reliably editing small (i.e., <1 square micron in width) metal features of an IC, preferably a copper feature embedded in an organic, that does not cause IC damage, surface area contamination, nor physical sputtering of the sample surface, as well as methods of making semiconductors using such edited ICs.

Another object of the present invention is to provide methods for providing consistent, exceptional clean cuts of a copper feature embedded in an organic layer in a single step process.

It is another object of the present invention to provide methods for editing a copper feature within an organic layer of an IC that does not destroy small defects in need of repair on the IC.

Still another object of the present invention is to provide methods for editing a copper feature buried within an organic layer that reduces any damage to the organic layer that the copper feature is embedded within.

Yet another object of the present invention is to provide methods that easily and efficiently allow the editing of small copper features, i.e., those copper features that are <1 square micron in size, embedded within an organic layer.

It is another object of the present invention to provide methods for editing a copper feature within an organic layer that is easy to "turn-off" the reaction at the exact moment that the copper feature is done being edited, or the exact moment that all desired material has been removed.

Another object of the present invention is to provide methods for editing a copper feature buried deeply within an organic layer without damaging the resultant IC.

The above and other objects and advantages of the invention will in part be obvious and will in part be apparent from the specification, are achieved in the present invention, which, is directed to in a first aspect a method of editing an integrated circuit by providing an integrated circuit having a metal feature within an organic layer. The organic layer is etched to form an opening at least over the metal feature thereby exposing at least a top of the metal feature and then a milling box is defined over the top of the metal feature. Portions of the metal feature exposed through the milling box are then milled using an ion beam in combination with an etchant, whereby a dwell time for exposing the portions of the metal feature to the ion beam is increased by at least an order of magnitude over a conventional dwell time.

In accordance with the invention, the metal feature is preferably a copper feature, the organic layer is a polyarylene (e.g., SiLK semiconductor dielectric sold by Dow Chemical Company) and the etchant is a $XeF_2$. A conventional dwell time is 1 millisecond. Preferably, the milling box is defined only over a portion of the top of the metal feature and has a width ranging from about 0.04 microns to less than about 1 micron. The invention may further include simultaneously milling portions of the organic layer exposed through the milling box using the gaseous etchant at the increased dwell time.

In the preferred embodiment, the step of providing the integrated circuit having the metal feature within the organic layer may include providing a first organic layer, depositing a second organic layer directly there-over, depositing the metal feature within the second organic layer and then depositing a third organic layer directly over second organic layer and the metal feature. In so doing, the opening in the third organic layer is etched, whereby the etching stops once the top of the metal feature is exposed, therein also exposing portions of the second organic layer. This opening is etched into the third organic layer using a $XeF_2$ gas at a dwell of 1 millisecond.

In the preferred embodiment, the metal feature may have a width ranging from about 0.04 microns to about 0.25 microns. In accordance with the invention, a flow rate of the etchant may also be adjusted, while the dwell time may also be increased by two orders of magnitude over the conventional dwell time.

In another aspect, the invention is directed to a method of editing an integrated circuit including providing an integrated circuit having a copper feature within an organic layer. The copper feature may have a width ranging from about 0.04 microns to less than about 1 micron. The organic layer is etched to form an opening at least over the copper feature to expose at least a portion of a top surface of the copper feature and a portion of the organic layer. A mill box is then defined over portions of the exposed top surface of the copper feature and the organic layer. Subsequently, these portions exposed through the milling box are then simultaneously milled using an ion beam in combination with a $XeF_2$ gas whereby a dwell time for ion beam exposure is increased by at least an order of magnitude over a conventional dwell time. Optionally, a flow rate of the $XeF_2$ gas may be adjusted or the dwell time may be increased by two orders of magnitude over the conventional dwell time. In accordance with the invention, the instant uniquely modified milling parameters preferably include a dwell time, for etching a copper feature embedded in an organic layer using $XeF_2$, of at least 10 milliseconds.

BRIEF DESCRIPTION OF DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION

Figure 1:
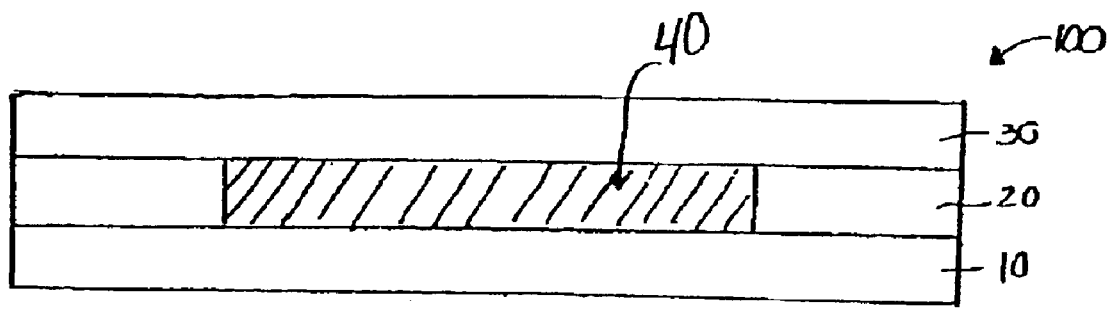
FIG. 1 illustrates a cross sectional view of the mill area to be processed on an initial substrate having a metal feature within an organic layer.

In describing the preferred embodiment of the present invention, reference will be made herein to FIGS. 1–9 of the drawings in which like numerals refer to like features of the invention. Features of the invention are not necessarily shown to scale in the drawings.

The present invention is directed to a method and system for editing metal features embedded in an organic layer using uniquely modified milling parameters during a dry etch process that allows for localization and control of the milling process. In the art of gas-assisted FIB processes, it is commonly believed that it is counter intuitive for a gas-assisted FIB process to run the dwell for a period longer than conventional dwell times, as the longer the dwell runs the more depleted the etchant gas becomes and thus the less efficient the milling process. However, it has now unexpectedly been found that by significantly increasing the dwell time for milling of metal features within organic layers, at least by an order of magnitude over conventional dwell times, beneficial results are obtained including enabling consistent, exceptional cuts of metal features within organic layers and depositing trace or substantially no conductive residue onto adjacent areas of the IC. That is, in accordance with the invention, it has been found that the efficiency of milling metal features in organic layers dramatically increases by milling such features in a gas-depleted environment at significantly increased dwell times. The invention will be better understood in accordance with the description below in reference to FIGS. 1–9.

Referring to FIG. 1, an initial semiconductor substrate is provided including a first inter-level dielectric layer (ILD)

layer 10 followed by a second ILD layer 20. A metal feature 40 is provided within at least the second ILD layer and then a third ILD layer 30 is conformally deposited over the metal feature 40 and the second ILD layer 20. In the preferred embodiment, the ILD layers 10, 20, 30 may comprise organic materials including, but not limited to, a low-k dielectrics such as (a) polyarylenes (e.g., SILK semiconductor dielectric sold by Dow Chemical Company) described in U.S. Pat. No. 5,965,679, (b) poly(arylene ethers), e.g., PAE™ resins (sold by Air Products Corp.) described in EP 0 755 957 B1, the Flare™ resins (sold by Allied Signal Corp.), or as described in U.S. Pat. Nos. 5,115,082; 5,155,175; 5,179,188, and 5,874,516 and in PCT published applications WO91/09081 and WO97/01593) (c) cross-linked polyphenylenes, as disclosed in WO97/10193, and the like. The organic may be porous or non-porous. The metal feature 40 preferably comprises a copper feature 40 embedded within an organic body 100.

Figure 2:
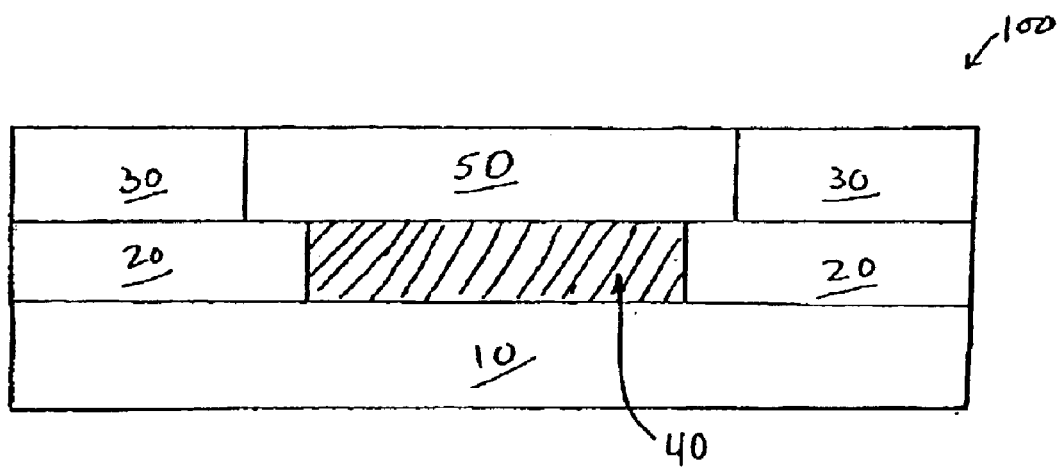
FIG. 2 illustrates a cross sectional view of forming an opening in the substrate of FIG. 1 directly over the metal feature.

As shown in FIG. 2, in the preferred embodiment, once the copper feature 40 is embedded within the organic body, an opening 50 is formed in the third ILD layer 30 by a known dry etch process. Preferably, the opening 50 is formed in the third ILD layer 30 using a dry etch gas-assisted FIB process, particularly, a FIB tool in combination with a $XeF_2$ gas at conventional milling parameters. Conventional milling parameters for $XeF_2$ milling of an organic layer are at a dwell of 1 millisecond and BT setting of 0.5. The dry etching process using these conventional milling parameters continues until a top surface of copper feature 40 is exposed, as well as portions of ILD layer 20 immediately surrounding the copper feature are exposed.

Figure 3:
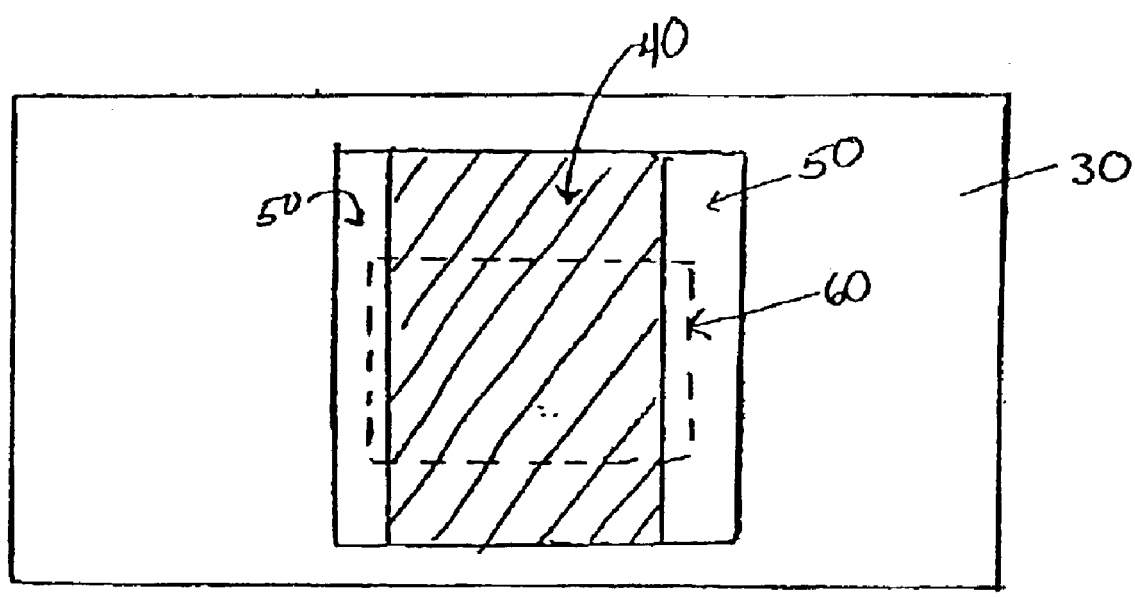
FIG. 3 illustrates a top plan view of the metal milling box defined over the exposed metal feature of FIG. 2.

After the top surface of the copper feature 40 is exposed, a milling box 60 is defined by known techniques through the FIB user interface. As shown in FIG. 3, the milling box is defined within the first opening 50, at least over that portion of the exposed copper feature 40 that is to be milled using the modified milling parameters of the invention. The milling box may also be defined over exposed portions of the second ILD layer. This milling box defines the area where the ion beam of the FIB tool will be focused onto the exposed surface of the copper feature in need of repair. Advantageously, the invention allows for etching features having top plan view widths below 1 micron in dimension. In so doing, the dimensions of the milling boxes preferably range from about 0.04 microns in width to less than 1 micron in width, however, the invention may be used to edit features having even smaller or larger widths. Once the milling box 60 is defined by the FIB user interface within opening 50, the exposed copper feature 40 may then be milled using the modified milling parameters of the invention, which are adjusted at the FIB program user interface. The instant critical modified gas-assisted FIB mill parameters for milling metal features in an organic layer include adjusting the mill dwell time, i.e., the duration of directing the focused ion beam at the exposed metal feature, by at least an order of magnitude over conventional metal feature dwell times. The dwell time may be adjusted alone or in combination with modifying the etchant flow rate by adjusting the BT settings at the FIB tool user interface.

In the preferred embodiment, after the milling box 60 is defined the copper feature 40 as well as exposed portions of the organic layer, preferably a copper line deeply embedded within the organic layer, are both edited in a single step by using a $XeF_2$ gas in a FIB process whereby at least the $XeF_2$ mill dwell time is increased at least by an order of magnitude over conventional $XeF_2$ milling of copper in organic at a dwell of 1 millisecond and gas pressure of 0.5 Torr (BT 0.5).

That is, it has been discovered that a critical feature of the invention is that the dwell time of the modified $XeF_2$ milling parameters for editing copper features in organic layers be at least equal to 10 milliseconds, or even greater, to achieve the new and unexpected results including consistently providing clean cuts of copper features while simultaneously depositing minimal conductive residue. Wherein the $XeF_2$ milling dwell time is increased greater than an order of magnitude over the conventional $XeF_2$ milling dwell time, such as by two orders of magnitude (dwell of 100 milliseconds), the results of the invention show even further consistent, clean copper cuts and trace, if any, conductive residues. In the invention, the flow rate of the gaseous $XeF_2$ etchant may also be adjusted in combination with the dwell time parameter. In so doing, the flow rate of the gaseous $XeF_2$ etchant may be adjusted from 0.5 Torr (BT setting 1.0) to 2.0 Torr (BT setting 2.0). Thus, in accordance with the instant single step process, the invention mills both the exposed copper feature and the exposed organic layer simultaneously while avoiding the problems of graphitization, destruction of the organic layer, such as by making the same conductive, and metal redeposition.

Figure 4A:
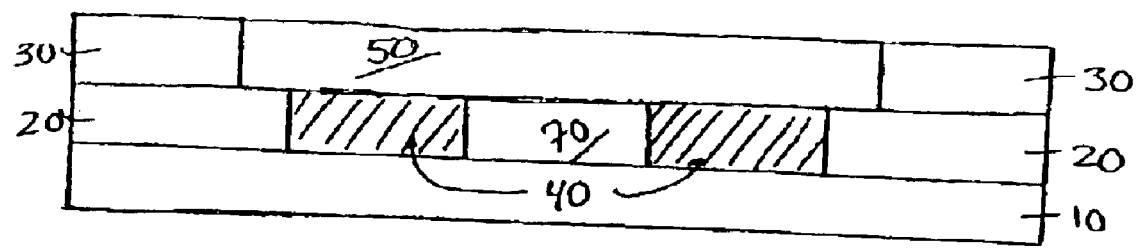
FIG. 4A illustrates a cross sectional view of the substrate of FIG. 3 after the metal feature is cut with the enhanced $XeF_2$ milling parameters of the invention.
Figure 4B:
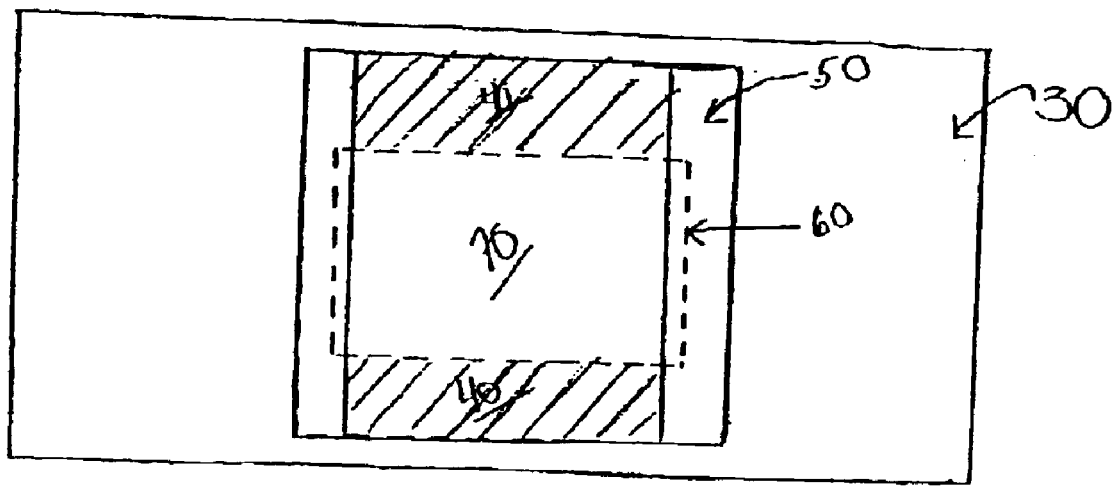
FIG. 4B illustrates a top plan view of the copper feature of FIG. 4A after being cut with the enhanced $XeF_2$ milling parameters.

As shown in FIG. 4, the modified dry etching parameters of the invention using the $XeF_2$ gas completely remove portions of the copper feature exposed through mask 60 to create an opening 70 in the copper feature, thereby exposing a portion of the underlying ILD layer 10. Using the instant milling process and system, copper features 40 within organic layers can now be consistently and cleanly cut into copper lines to provide complete isolation between these copper lines and exceptional voltage contrast as shown in the top plan view of FIG. 4A. Advantageously, the invention may be used to edit small metal features, preferably those having dimensions ranging from about 0.04 microns, or smaller, to less than 1.0 micron, more preferably, those having dimensions ranging from about 0.04 microns to about 0.25 microns.

For ease of understanding the invention, FIGS. 5–9 illustrate comparative results of milling efficiencies of $XeF_2$ on copper features in SiLK semiconductor dielectric under conventional milling parameters versus the instant modified milling parameters.

Figure 5:
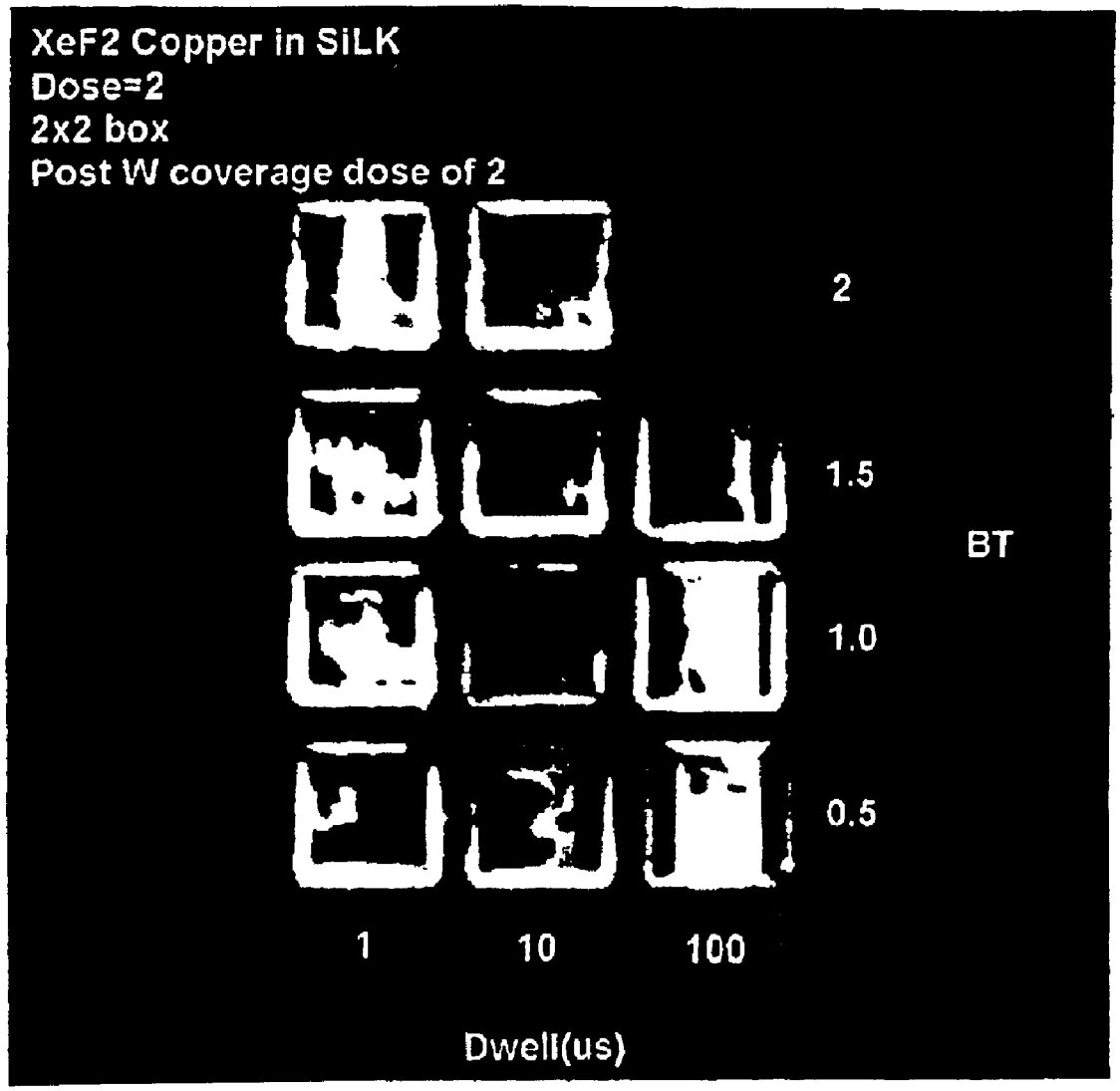
FIG. 5 illustrates a top plan view of an array of mill boxes showing the conventional $XeF_2$ mill of copper in SiLK at a dwell of 1 millisecond versus the instant critical $XeF_2$ mill of copper in SiLK dwell times of at least an order of magnitude greater than the conventional $XeF_2$ mill dwell time.

FIG. 5 illustrates a top plan view of these results showing an array of mill boxes at the conventional dwell time of $XeF_2$ milling of copper features in SiLK of 1 millisecond versus the instant modified dwell times of at least an order of magnitude greater than the conventional $XeF_2$ milling dwell time of 1 millisecond. In order to maintain the topology of each mill box bottom, a tungsten dose of 2 was deposited over the mill box array. In the FIG. 5 illustration, the bright white areas represent remaining copper not removed by the milling processes of the experiment while the shaded gray areas represent lower lying metal features exposed by such mill processes.

As can be seen, the mill boxes show the $XeF_2$ milling of copper features in SiLK for 1 millisecond at varying BT settings of 0.5, 1.0, 1.5 and 2. The only $XeF_2$ mill box at the conventional dwell of 1 millisecond that exhibits acceptable, clean milling of copper features buried within an organic layer, while also exposing lower lying metal features as depicted by the gray shaded areas, is at the conventional BT setting of 0.5. The remaining three mill boxes for the conventional dwell of $XeF_2$ milling for 1 millisecond at BT settings of 1.0, 1.5 and 2 all exhibit unacceptable, incomplete milling of the copper feature as shown by the bright white areas representing remaining copper, in addition to exposing some lower metal features.

The resultant clean cuts of copper features within organic layers formed using the newly discovered critical dwell times of the invention of at least one order of magnitude over conventional XeF$_2$ dwell time of 1 millisecond are also shown in FIG. 5. As illustrated, the ideal modified milling parameters of the invention are at a XeF$_2$ dwell of 100 milliseconds at a BT setting of 2.0. The mill box corresponding to such modified parameters shows complete removal of the portion of the copper feature in need of repair without exposing any lower lying metal features. Clean copper milling is also demonstrated in accordance with the invention at the modified milling parameter settings of dwell 10, BT 1.0 and dwell 10, BT 1.5, however, at these settings some lower lying metal features are also exposed. The remaining copper mill boxes (dwell 10, BT 0.5; dwell 10, BT 2.0; dwell 100, BT 0.5; dwell 100, BT 1.0 and dwell 100, BT 1.5) show incomplete milling of the upper copper line in addition to exposure to lower lying metal features.

FIGS. 6–9 show isochoric (constant BT) cross-sectional views of the mill boxes of FIG. 5 further demonstrating the experimental results of varying dwell and BT milling parameters during XeF$_2$ milling of copper features in organic layers.

Figure 6:
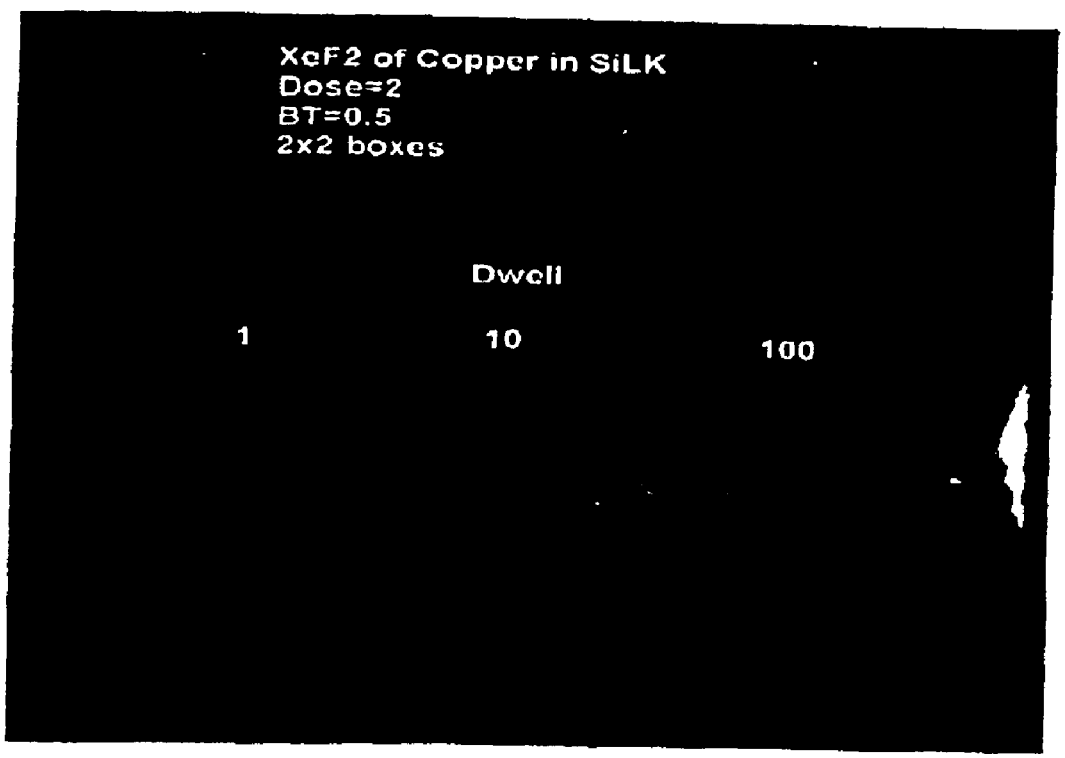
FIG. 6 illustrates a cross sectional view along BT setting 0.5 of the mill box array shown in FIG. 5.
Figure 7:
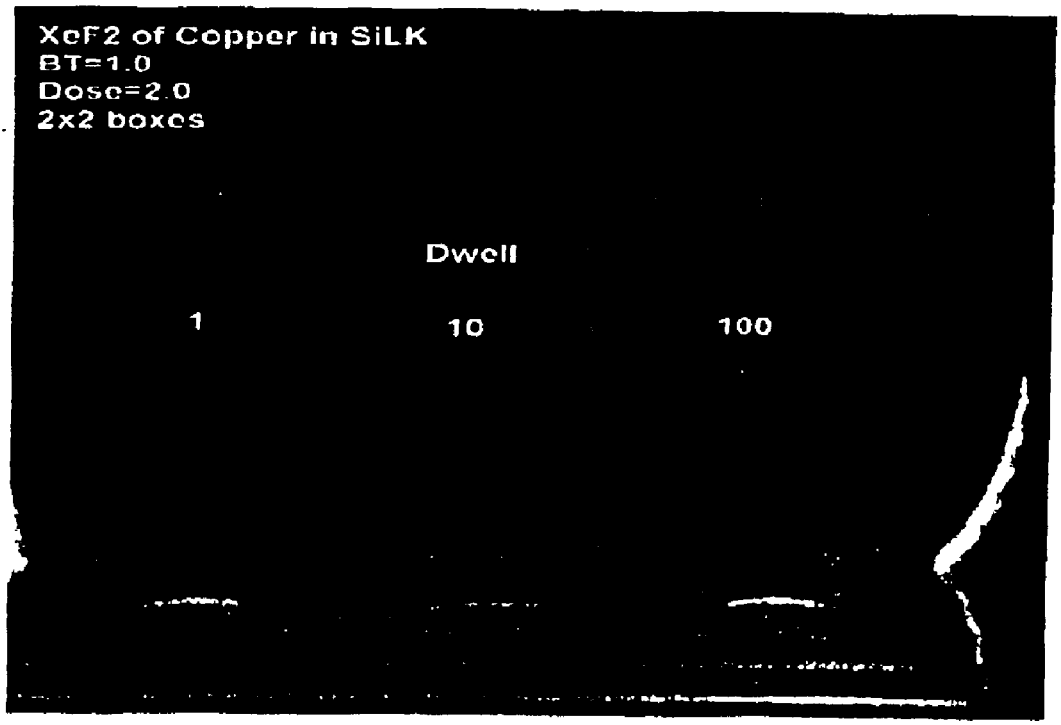
FIG. 7 illustrates a cross sectional view along BT setting 1.0 of the mill box array shown in FIG. 5.
Figure 8:
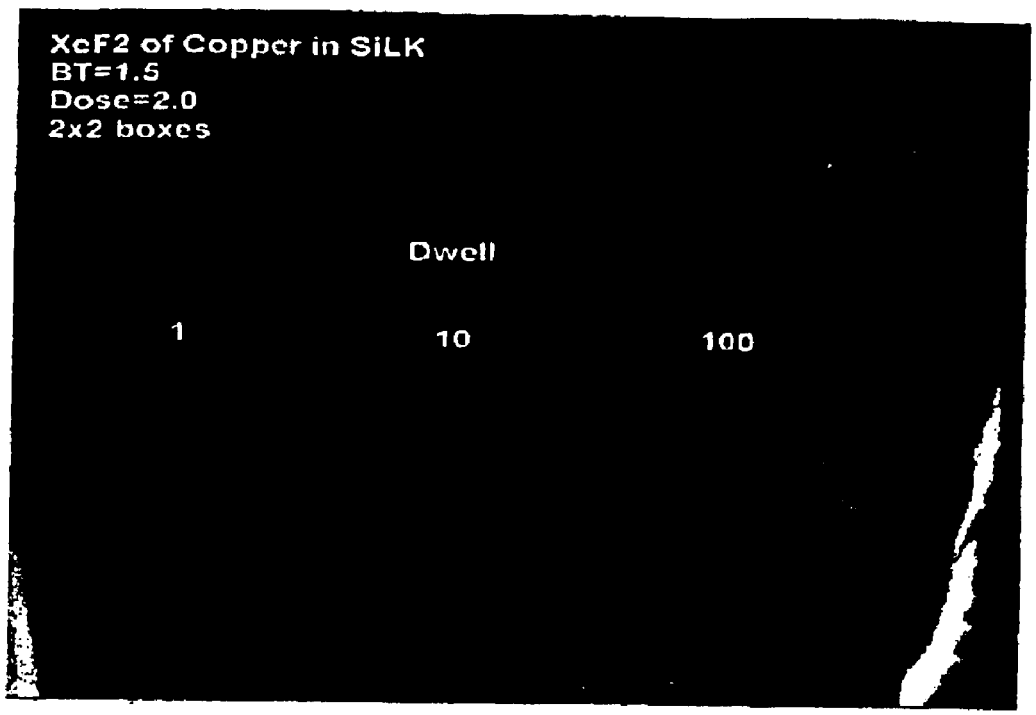
FIG. 8 illustrates a cross sectional view along BT setting 1.5 of the mill box array shown in FIG. 5.
Figure 9:
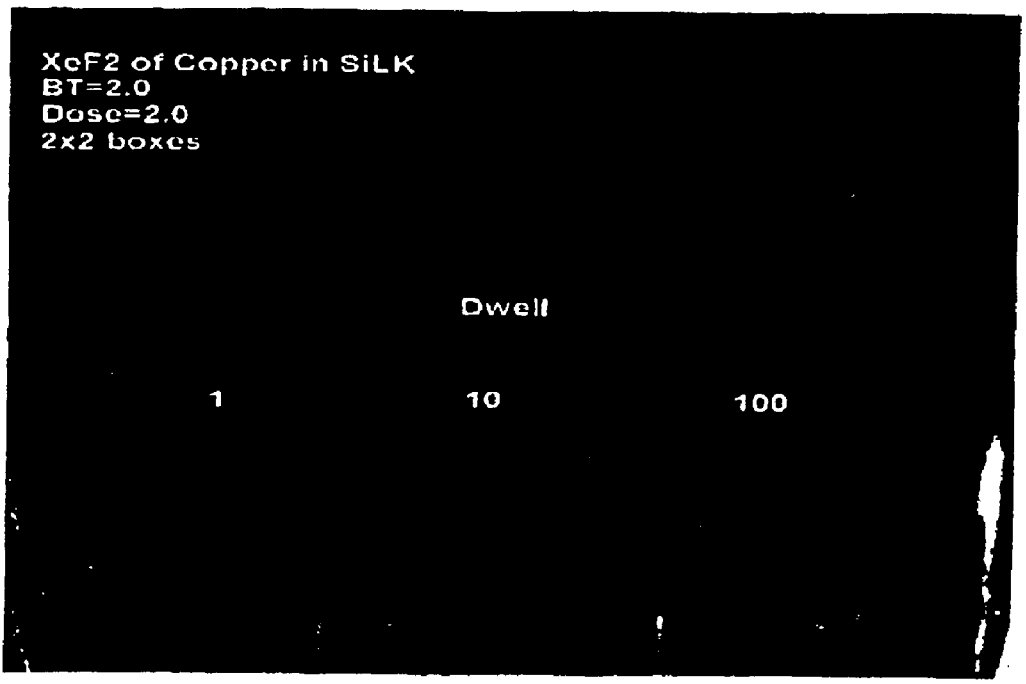
FIG. 9 illustrates a cross sectional view along BT setting 2.0 of the mill box array shown in FIG. 5.

FIG. 6 illustrates the cross-sectional view of XeF$_2$ milling of copper in an organic layer across the constant BT setting of 0.5. As shown, only the conventional XeF$_2$ milling at dwell 1, BT 0.5 provides a somewhat smooth even milling profile. All other milling BT settings (BT 1.0, 1.5 and 2.0) at the conventional dwell time of 1 millisecond show significant selectivity of the SiLK layers over the copper feature, thereby etching the SiLK layers significantly faster than the copper feature. This affect can be seen by the cross-sectional views of FIGS. 7–9. As illustrated in FIGS. 7–9, the dwell 1 at BT settings 1.0, 1.5 and 2.0 show regions of SiLK within the mill box being etched to a depth greater than the shallower regions where the copper feature resides. Further shown in FIGS. 7–9, as the BT settings increase, the rate at which the SiLK is etched also increases, and hence, the amount and depth of SiLK etched increases. These three (3) mill boxes for the conventional dwell of XeF$_2$ milling for 1 millisecond at BT settings of 1.0, 1.5 and 2 all exhibit unacceptable, incomplete milling of the copper feature, as depicted by the bright white areas. The results of XeF$_2$ milling at the conventional dwell time of 1 millisecond at varying BT settings are due to the process being primarily a chemically driven process, rather than a physical process. This affect is shown by the organic layer being etched faster than the copper feature, as the etching of the copper feature is not enhanced by increasing the BT setting of the XeF$_2$ mill process at dwell of 1 millisecond.

In accordance with the modified milling parameters of the invention, for a dwell of 10 the BT settings of 1.0 and 1.5 exhibit exceptional clean milling of copper features buried within an organic layer as represented by the mill box having a smooth bottom. However, the settings of dwell 10, BT 0.5 and dwell 10, BT 2.0 show that the bottom of the mill box is substantially unevenly etched, with the organic layer being etched faster than the copper features. Accordingly, the modified milling parameter of dwell 10, BT 1.0 and dwell 10, BT 1.5 are ideal for milling through the copper feature while having topography to lower lying metal features. Still further, at the nominal modified parameter settings of dwell 100, BT 2.0 the copper feature in need of editing is milled to essentially the desired amount as a result of milling in a substantially gas-depleted environment, as shown by the corresponding mill box having a substantially planar bottom surface with minimal surface topography.

Accordingly, wherein milling at a fast rate is desired with small variations being acceptable, the instant modified parameter settings of dwell 10, BT 1.0 or dwell 10, BT 1.5 may be used to provide consistent, clean cuts of a copper feature within an organic layer. Alternatively, wherein constant smooth milling is desired, a dwell of 100 and any BT setting will provide substantially planar bottoms, however, if consistent, clean cuts of a copper feature within an organic layer is desired then the instant ideal modified parameter setting of dwell 100, BT 2.0 may be used to edit the copper feature. Thus, in accordance with the modified milling parameters of the invention, by controlling the dwell time of the mill process, the milling of the copper feature and the organic layers advantageously can be equilibrated to simultaneously etch both the copper feature and the organic layers at substantially equal depths to provide a substantially planar bottom surface within the mill box.

Advantageously, the instant invention provides methods that enable localization and control of desired milling parameters by modifying the dwell time within a FIB process to provide consistent, clean cuts of metal features that are deeply embedded within organic layers. By modifying the dwell time, and optionally the gas flow rate, of the milling parameters, both metal features and organic layers they are deeply embedded within can be milled simultaneously in a single step with minimal conductive residue being deposited onto adjacent areas of the IC being processed/milled. The invention also allows editing of copper feature in organics with very little induced etch topology (smooth mill box bottoms).

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having decribed the invention, what is claimed is:

1. A method of editing an integrated circuit comprising:
   providing an integrated circuit having a metal feature within an organic layer;
   etching said organic layer using an ion beam in combination with an etchant to form an opening at least over said metal feature thereby exposing at least a top of said metal feature;
   defining a milling box over said top of said metal feature; and
   milling portions of said metal feature exposed through said milling box using said ion beam in combination with said etchant for a dwell time of at least 10 milliseconds to provide consistent, clean cuts of said metal feature.

2. The method of claim 1 wherein said metal feature comprises a copper feature.

3. The method of claim 1 wherein said organic layer comprises an organic material selected from the group consisting of SiLK and SiO$_2$.

4. The method of claim 1 wherein said etchant comprises a XeF$_2$.

5. The method of claim 1 wherein said dwell time is at least an order of magnitude over a conventional dwell time of 1 millisecond.

6. The method of claim 1 wherein said milling box is defined only over a portion of said top of said metal feature.

7. The method of claim 1 further including simultaneously milling portions of said organic layer exposed through said milling box using said gaseous etchant at said increased dwell time.

8. The method of claim 1 wherein the step of providing said integrated circuit having said metal feature within said organic layer comprises:

provviding a first organic layer;

depositing a second organic layer directly over said first organic layer;

depositing said metal feature within said second organic layer; and depositing a third organic layer directly over second organic layer and said metal feature within said second organic layer.

9. The method of claim 8 wherein the step of etching said organic layer to form said opening at least over said metal feature thereby exposing at least said top of said metal feature comprises:

etching an opening in said third organic layer stopping once said top of said metal feature is exposed, thereby also exposing portions of said second organic layer.

10. The method of claim 9 wherein the opening is etched into said third organic layer using a $XeF_2$ gas at a dwell of 1 millisecond.

11. The method of claim 9 wherein the step of defining the milling box over said top of said metal feature comprises:

defining the mill box within said opening over a portion of said exposed metal feature.

12. The method of claim 1 wherein said mill box has a width ranging from about 0.04 microns to less than about 1 micron.

13. The method of claim 1 further including the step of adjusting a flow rate of said etchant.

14. The method of claim 1 wherein said dwell time is about 100 milliseconds.

15. The method of claim 1 wherein said metal feature has a width ranging from about 0.04 microns to about 0.25 microns.

16. A method of editing an integrated circuit comprising:

providing an integrated circuit having a copper feature within a low-k organic layer;

etching said low-k organic layer using an ion beam in combination with a $XeF_2$ gas to form an opening at least over said copper feature to expose at least a portion of a top surface of said copper feature and a portion of said low-k organic layer;

defining a milling box over portions of said exposed portions of said top surface of the copper feature and said low-k organic layer; and milling said exposed portions of the top surface of the copper feature and said low-k organic layer exposed through said milling box simultaneously, in a single step using said ion beam in combination with said $XeF_2$ gas whereby a dwell time for said ion beam exposure is at least 10 milliseconds to provide consistent, clean cuts of said copper feature.

17. The method of claim 16 further including the step of adjusting a flow rate of said $XeF_2$ gas.

18. The method of claim 16 wherein said dwell time is increased to about 100 milliseconds.

19. The method of claim 16 wherein said copper feature has a width ranging from about 0.04 microns to less than about 1 micron.

20. A method of editing an integrated circuit comprising:

providing an integrated circuit having a copper feature embedded within a low-k organic layer;

etching said low-k organic layer using an ion beam in combination with a $XeF_2$ gas to form an opening at least over said copper feature thereby exposing a portion of a top surface of said copper feature and a portion of said low-k organic layer;

defining a milling box over portions of said exposed portions of the top surface of said copper feature and said low-k organic layer; and milling said exposed portions of the top surface of said copper feature and said low-k organic layer exposed through said milling box simultaneously, in a single step using said ion beam in combination with said $XeF_2$ gas for a dwell time of at least 10 milliseconds, thereby exposing underlying portions of said low-k organic layer and isolating adlacent sections of said copper feature to form copper lines.

* * * * *